United States Patent [19]

Kawaguchi

[11] Patent Number: 4,888,568
[45] Date of Patent: Dec. 19, 1989

[54] LC FILTER

[75] Inventor: Masahiko Kawaguchi, Nagaokakyo, Japan

[73] Assignee: Murata Manufacturing Co., Ltd., Japan

[21] Appl. No.: 166,570

[22] Filed: Mar. 11, 1988

[30] Foreign Application Priority Data

Mar. 13, 1987 [JP] Japan .................................. 62-59764

[51] Int. Cl.$^4$ ............................................... H03H 7/12
[52] U.S. Cl. .................................... 333/174; 333/172; 333/184; 333/185; 333/205; 361/392
[58] Field of Search ..................... 333/174–177, 333/181, 184, 185, 167, 168, 12, 172, 204, 205; 336/200; 361/392

[56] References Cited

U.S. PATENT DOCUMENTS

| | | | |
|---|---|---|---|
| 2,001,282 | 5/1935 | Nyman | 361/392 |
| 2,751,558 | 6/1956 | Grieg et al. | 333/204 |
| 3,947,934 | 4/1976 | Olson | 333/175 X |
| 4,063,201 | 12/1977 | Komatsubara et al. | 333/177 X |
| 4,287,602 | 9/1981 | Kessler | 333/176 |
| 4,754,242 | 6/1988 | Okamura et al. | 333/184 X |

Primary Examiner—Eugene R. LaRoche
Assistant Examiner—Seung Ham
Attorney, Agent, or Firm—Ostrolenk, Faber, Gerb & Soffen

[57] ABSTRACT

An LC filter includes a dielectric base plate having throughholes, and pluralities of first and second inductance conductors are formed on the both main surfaces of the dielectric base plate, respectively. The respective first and second inductance conductors are paired by being electrically connected through the throughholes and, thereby a plurality of inductors are formed. A capacitor is formed by first and second capacitance electrodes which are formed on both main surfaces of the dielectric base plate at positions opposing each other. The plurality of inductors and the capacitor are suitably connected. First and second additional electrodes are formed on both main surfaces of dielectric base plate at positions opposing each other so that a capacitor for trimming is formed by the additional electrodes. The capacitor for trimming is connected in parallel with at least one of the plurality of inductors. By trimming the first and/or the second additional electrodes, a capacitance value of the capacitor for trimming is changed, whereby a resonant frequency, determined by the inductor to which the capacitor for trimming is connected, can be adjusted.

4 Claims, 9 Drawing Sheets

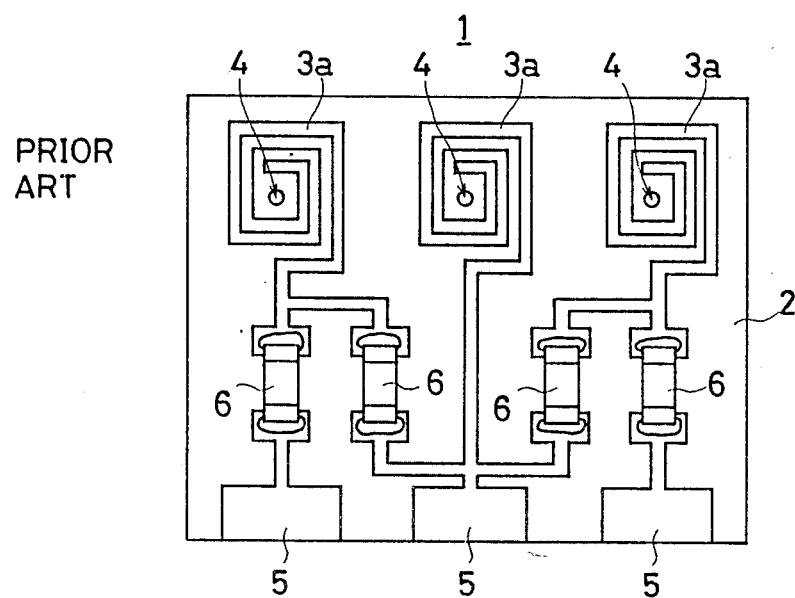
FIG.1B
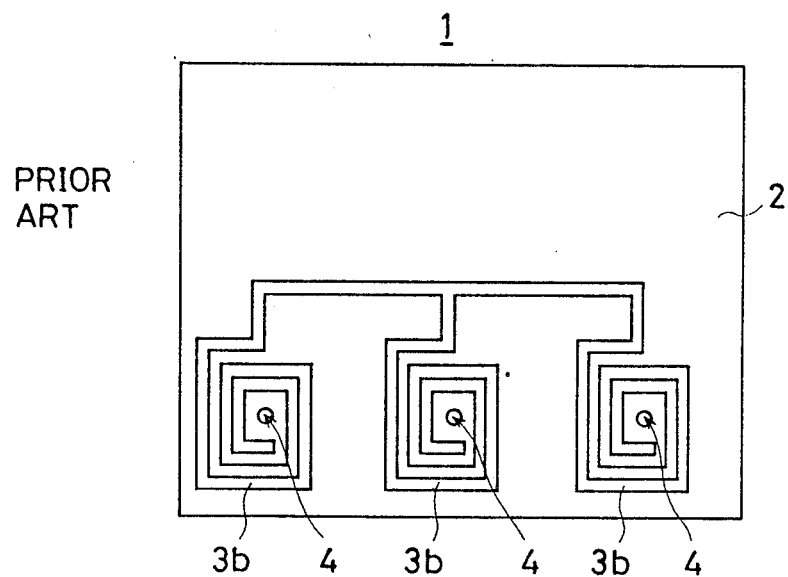

F I G. 12
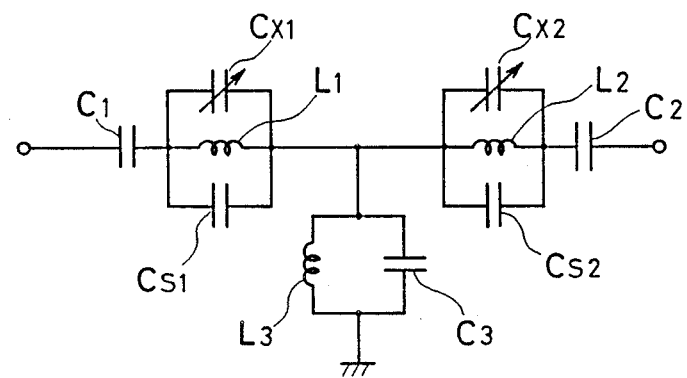
F I G. 13
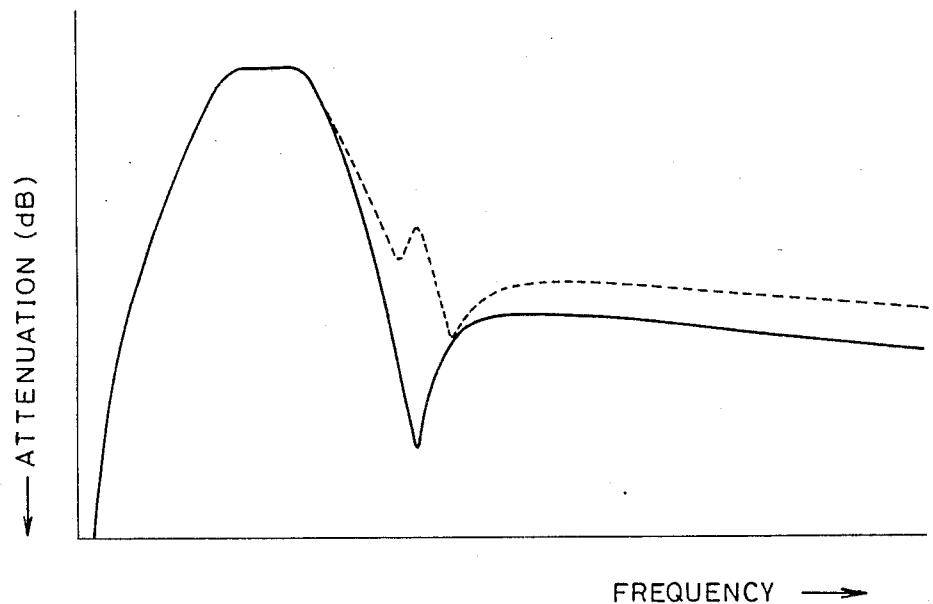

LC FILTER

BACKGROUND OF THE INVENTION
Field of the Invention

The present invention relates to an LC filter. More specifically, the present invention relates to an LC filter which includes a plurality of inductors connected to series between lines on which a high-frequency signal is transmitted, each of the inductors being constructed by a pair of inductance conductors which are formed on the both main surfaces of a base plate and connected to each other through a throughhole. Description of the Prior Art FIG. 1A and FIG. 1B are illustrative views showing one example of a conventional LC filter consituting the background of the invention, and FIG. 1A is a top plan view and FIG. 1B is a bottom plan view thereof. In an LC filter 1, first and second inductance conductors 3a, 3a, --- and 3b, 3b, --- are respectively formed on the both main surfaces of a base plate 2. These first and second inductance conductors 3a, 3a, --- and 3b, 3b, --- are electrically connected through throughholes 4, 4, --- for each pair so as to constitute a plurality of inductors. In addition, chip-type monolithic capacitors 6, 6, --- are mounted between the first inductance conductors 3a, 3a, --- and connecting terminals 5, 5, ---. Thus, the LC filter 1 is constructed by these inductors and capacitors.

In the above described conventional LC filter, since it is necessary to mount the chip capacitor on the base plate, there was a disadvanage that the manufacturing thereof is complex and therefore the cost thereof becomes high.

SUMMARY OF THE INVENTION

Therefore, a principal object of the present invention is to provide a novel LC filer.

Another object of the present invention is to provide an LC filter without necessity to mount discrete components.

The other object of the present invention is to provide an LC filter capable of eliminating or removing the influence of stray capacitance due to an inductance conductor.

An LC filter in accordance with the present invention comprises a dielectric base plate, a plurality of inductance conductors formed on a main surface of the dielectric base plate, the plurality of inductance conductors constituting a plurality of inductors. First and second capacitance electrodes are formed on one main surface or both main surfaces of the dielectric base plate so as to oppose to each other, and a capacitor is formed by the first and second capacitance electrodes. Furthermore, first and second additional electrodes are formed on one main surface or both main surfaces of the dielectric base plate so as to oppose to each other, and a trimming capacitor is formed by the first and second additional electrodes, which is connected in parallel with at least one of the plurality of inductors.

In accordance with a present invention, since it is not necessary to mount discrete components, an LC filter capable of being simply manufactured at a low cost is obtainable. In addition, since the capacitance value of the trimming capacitor can be adjusted by trimming the first and/or second additional electrodes, resonant frequencies determined by respective ones of the plurality of inductors can be made coincident with each other, and therefore a spurious response in a frequency characteristic can be suppressed.

These objects and other objects, features, aspecs and advantages of the present invention will become more apparent from the following detailed description of the embodiments of the present invention when taken in conjuncion with accompanying drawings.

BRIEF DESCRIPTION OF THE DRAWINGS

FIG. 1A and FIG. 1B are illustrative views showing one example of a conventional LC filter constituting the background of the invention, wherein FIG. 1A is a top plan view and FIG. 1B is a bottom plan view.

FIG. 2A and FIG. 2B are illustrative views showing one embodiment in accordance with the present invention, wherein FIG. 2A is a top plan view and FIG. 2B is a bottom plan view.

FIG. 5A and FIG. 5B are illustrative views showing one example of LC filter capable of avoiding one disadvantage of the conventional LC filter as shown in FIG. 1A and FIG. 1B, wherein FIG. 5A is a top plan view and FIG. 5B is a bottom plan view.

FIG. 8A and FIG. 8B are illustrative views showing another embodiment in accordance with the present invention, wherein FIG. 8A is a top plaln view and FIG. 8B is a bottom plan view.

FIG. 11A and FIG. 11B are illustrative views showing yet another embodiment in accordance with the prsent invention, wherein FIG. 11A is a top plan view and FIG. 11B is a bottom plan view.

FIG. 12 is a circuit diagram showing an equivalent circuit of the embodiment.

FIG. 13 is a graph showing a frequency characteristic of the embodiment.

DETAIL DESCRIPTION OF THE PREFERRED EMBODIMENT

Figure 2A:
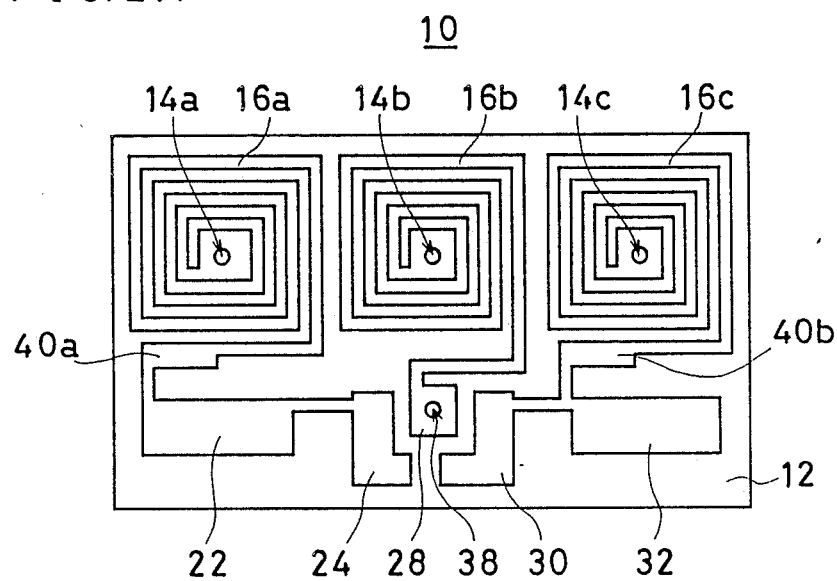
Figure 2B:
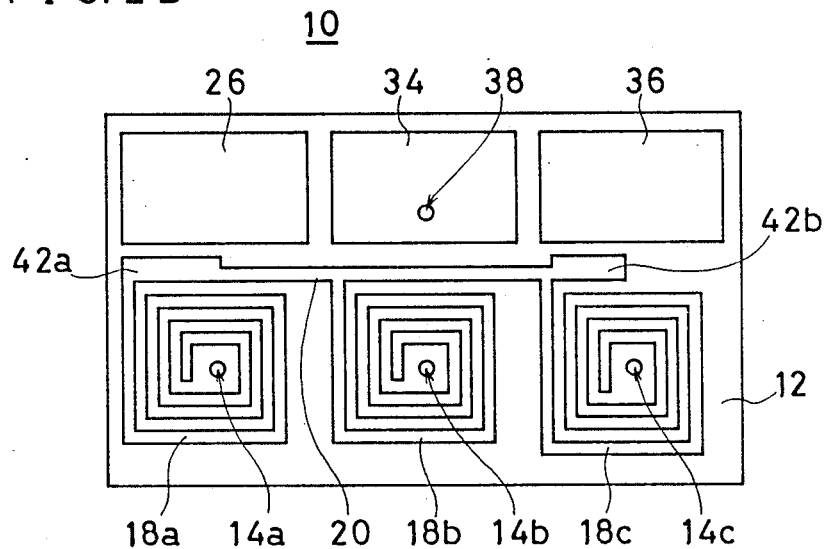

FIG. 2A is a top plan view showing one embodiment in accordance with the present invention, and FIG. 2B is a bottom plan view thereof. An L filter 10 includes a dielectric base plate 12 on which three throughholes 14a, 14b and 14c are formed in parallel with each other in a longitudinal direction of the dielectric base plate 12. In addition, on the dielectric base plate 12, there are formed first inductance conductors 16a, 16b and 16c in association with the above described three throughholes 14a, 14b and 14c. The first inductance conductors 16a, 16b and 16c are formed in a spiral fashion by means of printing or deposition. The first inductance conductors 16a, 16b and 16c are arranged such that the throughholes 14a, 14b and 14c are surrounded by respective first ends thereof.

Second inductance conductors 18a, 18b and 18c are formed on the other main surface of the dielectric base plate 12 so as oppose to the first inductance conductors 16a, 16b and 16c, respectively. The second inductance conductors 18a, 18b and 18c are arranged such that the aforementioned throughholes 14a, 14b and 14c are surrounded by respective first ends thereof.

Figure 3:
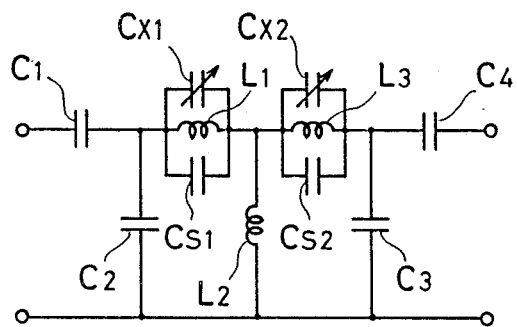
FIG. 3 is a circuit diagram showing an equivalent circuit of the embodiment.

A conductor (not shown) is fixed to an inner wall of the throughhole 14a, whereby the first end of the first inductance conductor 16a and the first end of the second inductance conductor 18a are electrically connected. Likewise, first ends of the first and second inductance conductors 16b and 18b are electrically connected by a conductor of the throughhole 14b, and first ends of the first and second inductance conductors 16c and 18c are electrically connected by a conductor of the throughhole 14c. An inductor $L_1$ as shown in FIG. 3 is formed by the first and second inductance conductors 16a and 18a. Likewise, an inductor $L_2$ are formed by the first and second inductance conductors 16b and 18b, and an inductor $L_3$ is formed by the first and second inductance conductors 16c and 18c. Then, the respective other (second) ends of the second inductance conductors 18a, 18b and 18c are electrically connected to each other by a connecting electrode 20. This means that the inductors $L_1$, $L_2$ and $L_3$ are connected by the connecting electrode 20 in a manner as shown in FIG. 3.

On the top main surface of the dielectric base plate 12, a capacitance electrode 22 is formed so as to be connected to the second end of the first inductance conductor 16a, andn a capacitance electrode 24 is formed such that the same is extended from the capacitance electrode 22 and connected thereto. A capacitance electrode 26 is formed on the botom main surface of the dielectric base plate 12 at a position opposing the above described capacitance electrode 22. A capacitor $C_1$ as shown in FIG. 3 is formed by the capacitance electrodes 22 and 26, the capacitor $C_1$ thus being connected to the second end of the inductor $L_1$.

In addition, on the top main surface of the dielectric base plate 12, an electrode 28 is formed so as to be connected to the second end of the first inductance conductor 16b, and capacitance electrodes 30 and 32 are formed such that the same are extended from the second end of the first inductance conductor 16c and connected thereto. A capacitance electrode 34 is formed on the bottom main surface of the dielectric base plate 12 at a position opposing the capacitance electrodes 24 and 30 and the electrode 28. In addition, a capacitance electrode 36 is formed on the bottom main surface of the dielectric base plate 12 at a position opposing the capacitance electrode 32. A capacitor $C_2$ as shown in FIG. 3 is formed by the capacitance electrodes 24 and 34, a capacitor $C_3$ is formed by the capacitance electrodes 30 and 34, and a capacitor $C_4$ is formed by the capacitance electrodes 32 and 36.

In addition, since a throughhole 38 is formed so as to be surrounded by the electrode 28, the electrode 28 and the capacitance electrode 34 can be electrically connected by forming a conductor (not shown) in the throughhole 38. Thus, as shown in an equivalent circuit of FIG. 3, the capacitor $C_2$ is connected between the second end of the inductor $L_1$ and the second end of the inductor $L_2$, the capacitor $C_3$ is connected between the second end of the inductor $L_3$ and the second end of the inductor $L_2$, and the capacitor $C_4$ is connected to the second end of the inductor $L_3$.

First additional electrodes, that is, trimming electrodes 40a and 40b are formed on the top main surface of the dielectric base plate 12. The trimming electrode 40a is connected to the second end of the first inductance conductor 16a and the trimming electrode 40b is connected to the second end of the first inductance conductor 16c. Second additional electrodes, that is, trimming electrodes 42a and 42b are formed on the bottom main surface of the dielectric base plate 12 so as to oppose the above described trimming electrodes 40a and 40b, respectively. The trimming electrode 42a is connected to the second end of the second inductance conductor 18a, and the trimming electrode 42b is connected to the second end of the second inductance conductor 18c.

Thus, a trimming capacitor $C_{X1}$ as shown in FIG. 3 is formed by the trimming electrodes 40a and 42a, and a trimming capacitor $C_{X2}$ is formed by the trimming electrodes 40b and 42b.

Figure 4:
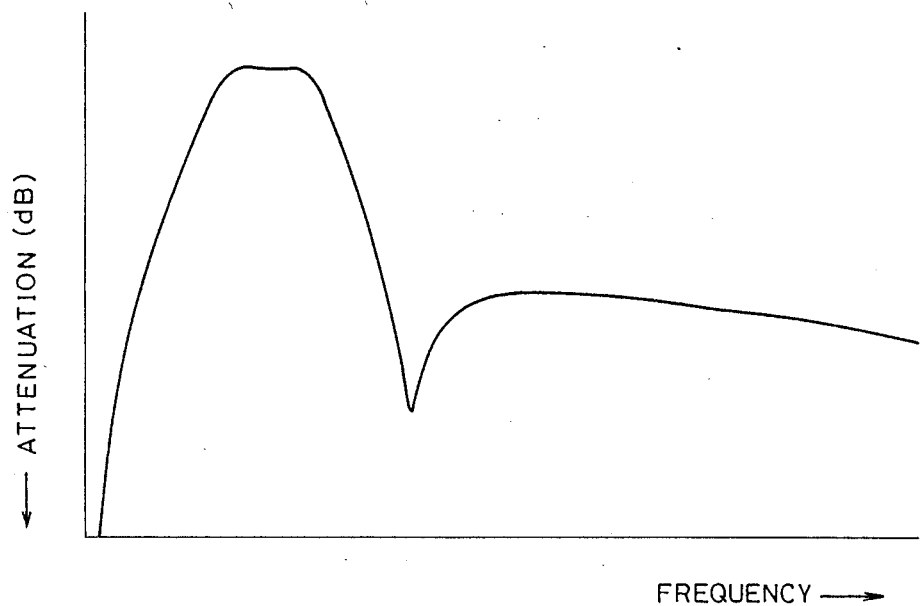
FIG. 4 is a graph showing a frequency characteristic of the embodiment.

In the LC filter 10 of the embodiment shown, as shown in the equivalent circuit of FIG. 3, a stray capaciance $C_{S1}$ is formed in the inductor $L_1$ by the first and second inductance conductors 16a and 18a, and the trimming capacitor $C_{X1}$ is connected in parallel thereto. Likewise, a stray capacitance $C_{S2}$ is formed in the inductor $L_3$ by the first and second inductance conductors 16c and 18c, and the trimming capacitor $C_{X2}$ is connected in parallel thereto. Therefore, the trimming capacitor $C_{X1}$ and $C_{X2}$ can be adjusted by working or trimming the trimming electrodes 40a and 40b and/or 42a and 42b, whereby resonant frequencies of the two inductors $L_1$ and $L_3$ can be made coincident with each other. Thus, the LC filter 10 having a frequency characteristic as shown in FIG. 4 can be obtained by making the resonant frequencies of respective inductors $L_1$ and $L_3$ coincident.

Figure 5A:
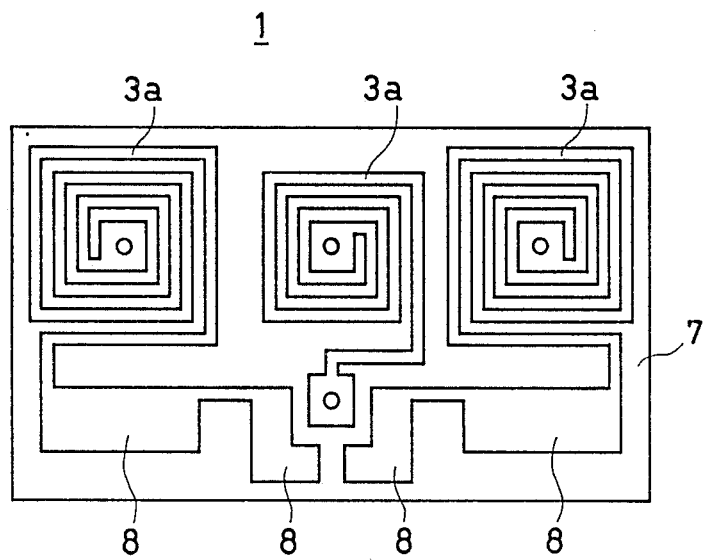
Figure 5B:
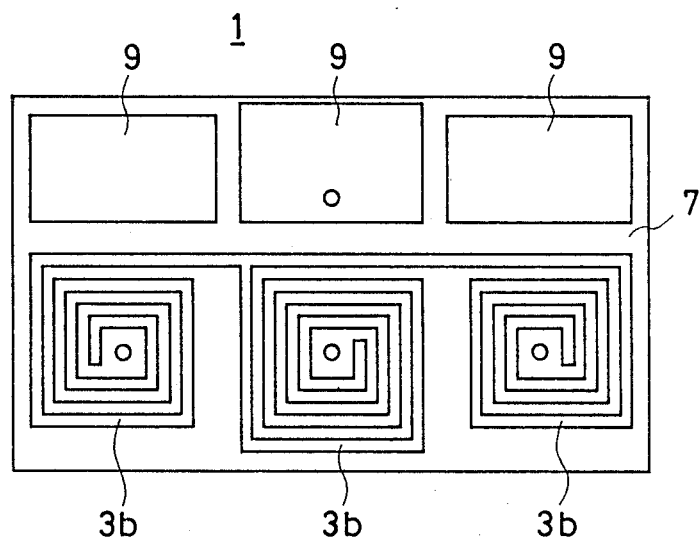
Figure 6:
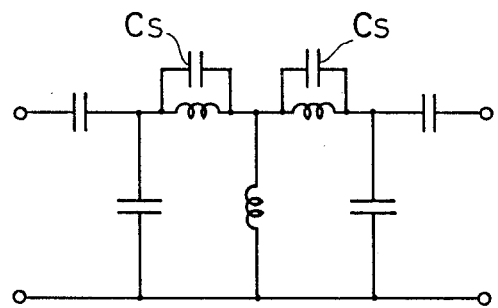
FIG. 6 is a circui diagram showing an equivalent circuit of the LC filter as shown in FIG. 5A and FIG. 5B.
Figure 7:
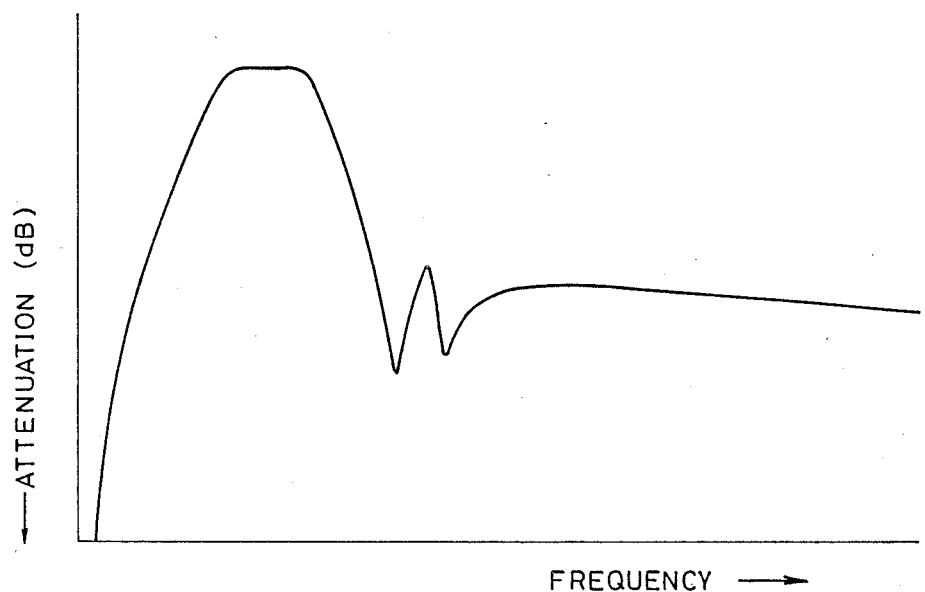
FIG. 7 is a graph showing a frequency characteristic of the LC filter as shown in FIG. 5A and FIG. 5B.

In the embodiment shown in FIGS. 5A and 5B, the disadvantage of the conventional LC filter 1 as shown in FIG. 1A and FIG. 1B is resolved simply. The capacitors are formed by making a base plate 7 from a dielectric material and by forming capacitance electrodes 8, 8, --- and 9, 9, --- on the base plate 7 as shown in FIGS. 5A and 5B. In the LC filter 1 as shown in FIG. 5A and FIG. 5B, there is an advantage thata it is not necessary to mount a discrete capacitor. However, a stray capacitance $C_S$ is formed in the inductance conductors, i.e. the inductor as shown in the equivalent circuit shown in FIG. 6, since a relative dielectric constant of the base plate is large 7. Due to the stray capacitance $C_S$, a spurious response takes place at the high-frequency side of the pass-band of the frequency characteristic thereof as shown in FIG. 7, and the frequency characteristic becomes bad occasionally. By contrast, in the embodiment of FIGS. 2A and 2B, by forming the trimming capacitors $C_{X1}$ an d$C_{X2}$ by means of the trimming electrodes 40a–42b in accordance with the present invention and by adjusting the same in the optimum condition, the LC filter 10 having a frequency characteristic in which no spurious response takes place as shown in FIG. 4 is obtainable.

In addition, in the above described embodiment of FIGS. 2A and 2B, the trimming capacitor $C_{X1}$ is formed in parallel with the inductor $L_1$, and the trimming capacitor $C_{X2}$ is formed in parallel with the inductor $L_3$; however, either one of the trimming capacitors may be formed and adjusted so that the resonant frequencies of the two inductors $L_1$ and $L_3$ become coincident with each other.

Figure 8A:
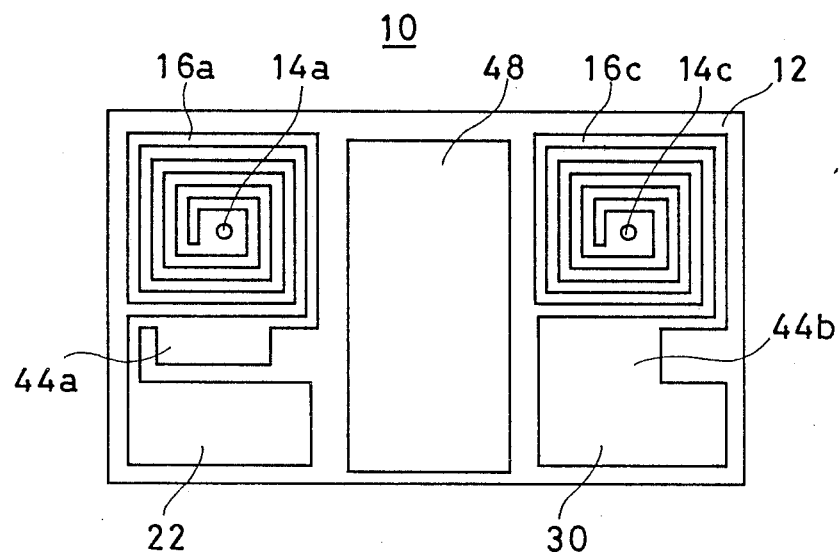
Figure 8B:
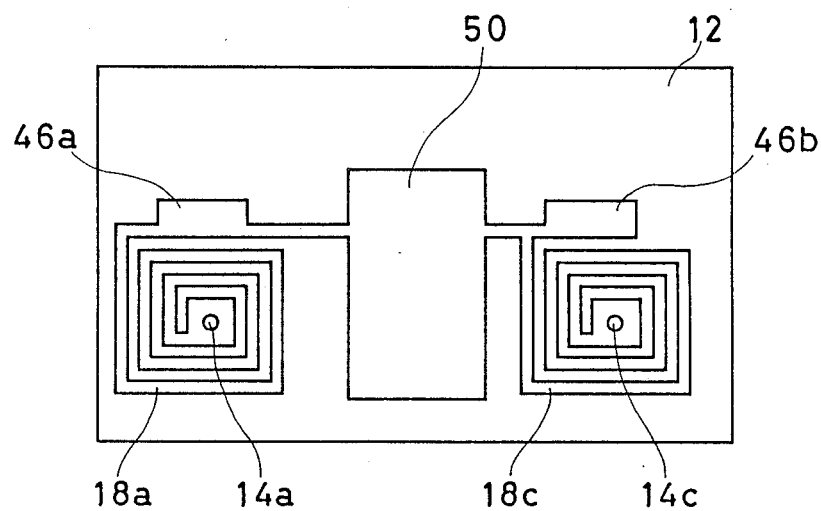

FIG. 8A and FIG. 8B are illustrative views showing another embodiment in accordance with the present invention, wherein FIG. 8A is a top plan view and FIG.

Figure 9:
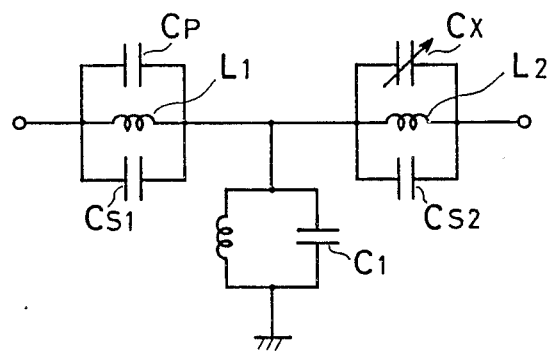
FIG. 9 is a circuit diagram showing an equivalelnt circuit of the embodimen.

8B is a bottom plan view. In this embodiment shown, the LC filter 10 is constructed as a low-pass filter having an equivalent circuit as shown in FIG. 9. In this embodiment, a capacitor $C_P$ for forming an attenuation pole as shown in FIG. 9 is formed by capacitance electrodes 44a and 46a which are formed on the both main surfaces of the dielectric base plate 12. Then, a capacitor $C_1$ as shown in FIG. 9 is formed by capacitance electrodes 48 and 50 each having relatively large area. The capacitance electrodes 48 and 50 are formed on the dielectric base plate 12 at approximately the center thereof. In addition, an inductance which is connected in parallel with the capacitor $C_1$ is formed by the residual inductance due to a conductor being formed on the dielectric base plate 12.

Figure 10:
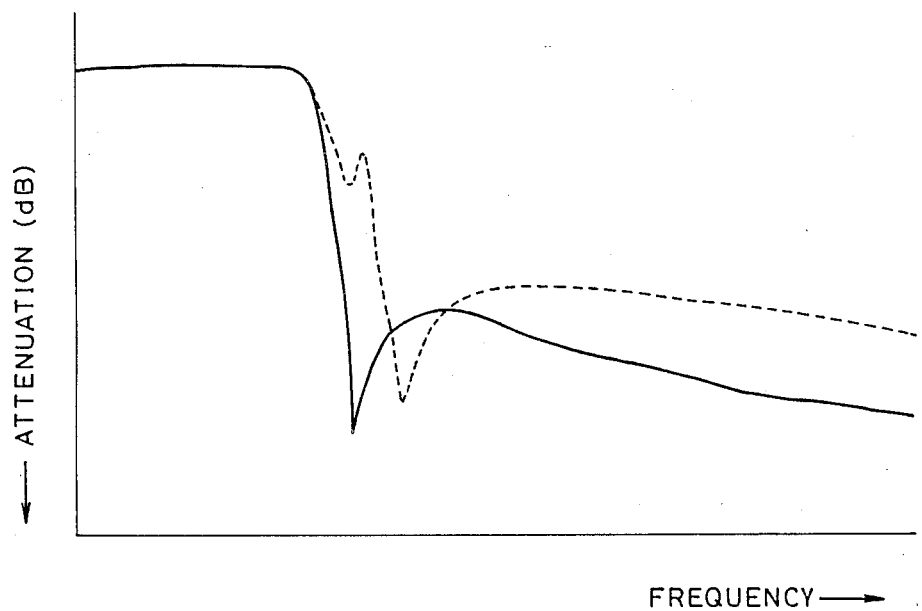
FIG. 10 is a graph showing a frequency characteristic of the embodiment.

In the embodiment as shown in FIG. 8A, FIG. 8B and FIG. 9, one attenuation pole is formed by the capacitor $C_P$, that is, the capacitance electrodes 44a and 46a; however, a spurious response due to the stray capacitance $C_{S1}$ formed by the first and second inductance conductors 16a and 18a takes place as shown by a dotted line in FIG. 10. Then, if the trimming capacitor $C_X$ is adjusted by working or trimming the trimming electrodes 44b and/or 46b, it is possible to form one sharp attenuation pole as shown by a solid line in FIG. 10.

Figure 11A:
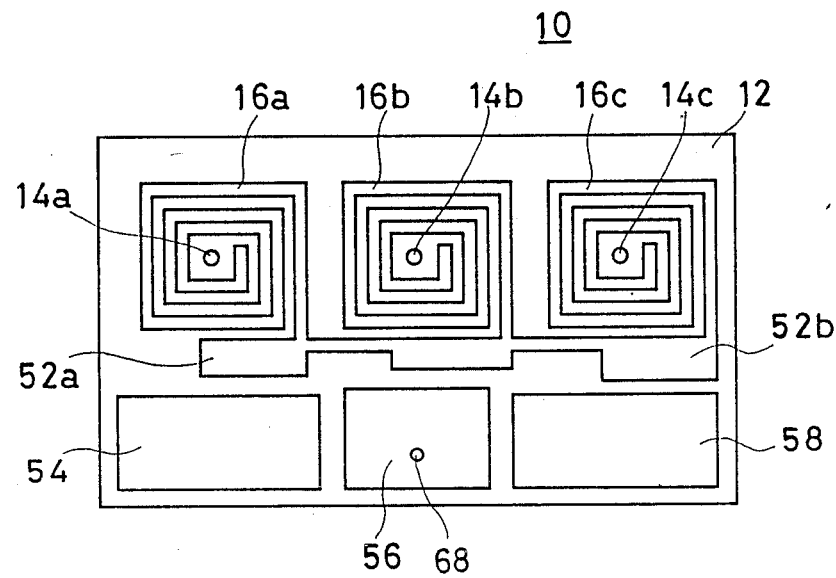
Figure 11B:
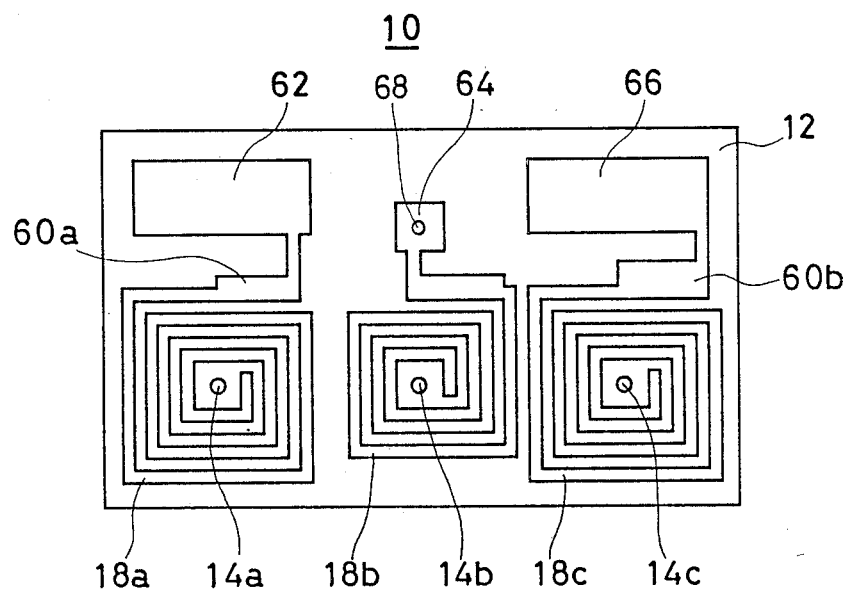

FIG. 11A and FIG. 11B are illustrative views showing another embodiment in accordance with the presen invention, wherein FIG. 11A is a top plain view and FIG. 11B is a bottom plan view. In this embodiment shown, the LC filter 10 is constructed as a band-pass filter having an equivalent circuit as shown in FIG. 12. In this embodimen, on one main surface of the dielectric base plate 12, there are formed trimming electrodes 52a and 52b and capacitance electrodes 54, 56 and 58. On the other main surface of the dielectric base plate 12, there are formed trimming electrodes 60a and 60b at positions respectively opposed to the trimming electrodes 52a and 52b, and capacitance electrodes 62, 64 and 66 at positions respectively opposed to the capacitance electrodes 54, 56 and 58. Then, a throughhole 68 penetrating the dielectric base plate 12 is formed at portion of the capacitance electrodes 56 and 64.

Therefore, a trimming capacitor $C_{X1}$ is formed by the trimming electrodes 52a and 60a, and a trimming capacitor $C_{X2}$ is formed by the trimming electrodes 52b and 60b. In addition, a capacitor $C_1$ is formed by the capacitance electrodes 54 and 62, and a capacitor $C_2$ is formed by the capacitance electrodes 58 and 66. The inductor $L_3$ is formed by the inductance conductors 16b and 18b, a capacitor $C_3$ is formed by the capacitance electrodes 56 and 64, and the capacitor $C_3$ is connected in parallel to the inductor $L_3$ through a conductor formed in the throughhole 68.

In this embodiment, if there are no trimming capacitors $C_{X1}$ and $C_{X2}$, a spurious response takes place as shown by a dotted line in FIG. 13; however, by adjusting the trimming capacitor $C_{X1}$ and/or $C_{X2}$, a frequency characteristic in which no spurious response takes place as shown by a solid line in FIG. 13 is obtainable.

In any of the above described embodiments, respective inductors are each constructed by a pair of inductance conductors which are formed on both main surfaces of the dielectric base plate 12 and connected to each other by the throughhole. However, one or more respective inductors may also be constructed by inductance conductors which are formed on only one main surface of the dielectric base plate. Likewise, respective capacitors and trimming capacitors may be formed by electrodes formed on only one main surface of the dielectricc base plate rather than the opposite electrodes formed on the both main surfaces of the dielectric base plate 12.

Although the present invention has been described and illustrated in detail, it is clearly understood that the same is by way of illustration and example only and is not to be taken by way of limitation, the spirit and scope of the present invention being limited only by the terms of the appended claims.

What is claimed:

1. An LC filter, comprising:
a dielectric base plate;
a plurality of inductance conductors formed on both main surfaces of said dielectric base plate, and forming a plurality of inductors; at least a pair of said plurality of inductance conductors on opposite sides of said base plate being interconnected through said base plate and thereby forming a first inductor;
first and second capacitance electrodes formed on at least one main surface of said dielectric base plate so as to oppose each other, at least one capacitor being formed by said first and second capacitance electrodes;
said at least one capacitor being connected to said first inductor by a first relatively narrow connecting conductor formed on said one main surface of said dielectric base plate and interconnecting said first capacitance electrode of said capacitor with said first inductor; and
first and second additional electrodes formed respectively as an enlarged portion of said first connecting conductor and as an enlarged portion of a second relatively narrow connecting conductor connected to said first inductor on the opposite main surface of said dielectric base plate so that said first and second additional electrodes oppose each other, a trimming capacitor being formed by said first and second additional electrodes, and said trimming capacitor being connected in parallel to said first inductor.

2. An LC filter in accordance with claim 1, wherein said plurality of inductance conductors include respective pluralities of first and second inductance conductors formed on different main surfaces of said dielectric base plate, said first and second inductance conductors being paired by being electrically connected to each other through a throughhole.

3. An LC filter in accordance with claim 2, wherein a further said first additional electrode is formed on one main surface of said dielectric base plate so as to be extended from a further one of said plurality of first inductance conductors, and a further said second additional electrode is formed on the other main surface of said dielectric base plate so as to be extended from a further one of said plurality of second inductance conductors, said second additional electrode opposing said first additional electrode.

4. An LC filer in accordance with claim 3, wherein a further said first capacitance electrode is formed so as to be extended from said further first additional electrode, and said further second capacitance electrode is formed so as to be extended from said further second additional electrode, said a further second capacitance electrode opposing said a further first capacitance electrode.

* * * * *